United States Patent [19]
Fukuma et al.

[11] Patent Number: 4,799,089
[45] Date of Patent: Jan. 17, 1989

[54] SEMICONDUCTOR MEMORY DEVICE

[75] Inventors: Hiroyuki Fukuma; Masashi Sato, both of Kawasaki, Japan

[73] Assignee: Fujitsu Limited, Kawasaki, Japan

[21] Appl. No.: 159,417

[22] Filed: Feb. 4, 1988

Related U.S. Application Data

[63] Continuation of Ser. No. 798,282, Nov. 15, 1985, abandoned.

[30] Foreign Application Priority Data

Nov. 20, 1984 [JP]  Japan ................................. 59-243304

[51] Int. Cl.$^4$ ...................... H01L 27/10; H01L 27/15
[52] U.S. Cl. ........................................ 357/45; 357/59; 357/15; 365/210
[58] Field of Search .............. 357/45, 45 M, 15, 59 G, 357/59 H, 59 K; 365/210, 175, 51, 63

[56]  References Cited

U.S. PATENT DOCUMENTS

| | | | |
|---|---|---|---|
| 3,540,010 | 11/1970 | Heightley et al. | 357/15 X |
| 3,686,644 | 8/1972 | Christensen | 357/15 X |
| 4,044,341 | 8/1977 | Stewart et al. | 365/210 |
| 4,479,200 | 10/1984 | Sato et al. | 365/175 |
| 4,551,820 | 11/1985 | Matsuura | 365/210 |

FOREIGN PATENT DOCUMENTS

| | | | |
|---|---|---|---|
| 0005601 | 11/1979 | European Pat. Off. | 365/175 |
| 55-61063 | 5/1980 | Japan | 357/15 M |

*Primary Examiner*—Andrew J. James
*Assistant Examiner*—Sara W. Crane
*Attorney, Agent, or Firm*—Staas & Halsey

[57] ABSTRACT

A semiconductor memory device, in which many memory cells formed by transistors having a Schottky barrier transistor as a load are arranged along word lines and the memory cells are driven from one end of the word lines by word drivers. Dummy cells are formed between the word drivers and the memory cells adjacent to the word drivers, so that a forward voltage of the memory cells adjacent to the word drivers is not affected by polycrystalline silicon in the word drivers.

7 Claims, 7 Drawing Sheets

SEMICONDUCTOR MEMORY DEVICE

This is a continuation of co-pending application Ser. No. 798,282 filed on Nov. 15, 1985 now abandoned.

BACKGROUND OF THE INVENTION

1. Field of the Invention

The present invention relates to a semiconductor memory device. More particularly, the present invention is directed to a semiconductor memory device in which a plurality of memory cells formed by transistors having a Schottky barrier transistor (SBD) as a load are arranged along word lines and the memory cells are driven from one end of the word lines by word drivers.

2. Description of the Related Art

Actual memory devices include many word lines. The potential of one of those word lines is made a high level so as to select the same. The structure of the word drivers includes polycrystalline silicon layers, while the memory cells do not. This affects the memory cells adjacent to word drivers and with SBDs as loads. The forward voltage $V_F$ of the SBDs in turn heavily affects the chracteristics of the semiconductor device.

Further, while cells adjacent to word drivers are postitioned between a word driver and another cell, other cells are positioned between the cells and have the same construction. Therefore, a peripheral portions around cells adjacent to word drivers are non-symmetrical in contruction with the result that special relationships, such as between the amount of aluminum and windows of bulk silicon, are spoiled.

SUMMARY OF THE INVENTION

An object of the present invention is to provide a semiconductor memory device in which memory cells adjacent to word drivers are not affected by polycrystalline silicon layers included in the word drivers.

Another object of the present invention is to provide a semiconductor memory device in which memory cells adjacent to word drivers are symmetrical in construction in the peripheral portions.

A further object of the present invention is to provide a semiconductor memory device in which a stable forward voltage is obtained for SBDs included in memory cells adjacent to word drivers.

The above-mentioned objects can be achieved by a semiconductor memory device, in which a plurality of memory cells formed by transistors having a Schottky barrier transistor as a load are arranged along word lines and the memory cells are driver from one end of the word lines by word drivers. Dummy cells are formed between the word drivers and memory cells adjacent to the word drivers, so that a forward voltage $V_F$ of the memory cells adjacent to the word drivers is not affected by polycrystalline silicon in the word drivers.

BRIEF DESCRIPTION OF THE DRAWINGS

Further features and advantages of the present invention will be apparent from the ensuing description with reference to the accompanying drawings, in which.

DESCRIPTION OF THE PREFERRED EMBODIMENTS

Figure 1:
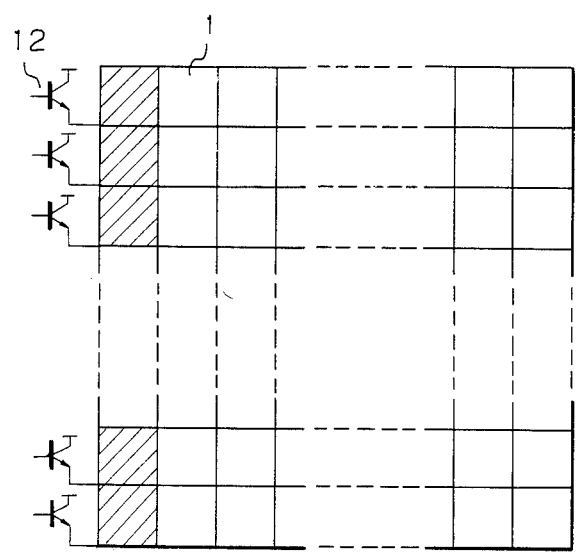
FIG. 1 is the layout of a conventional semiconductor memory device.

FIG. 1 shows the layout of a conventional semiconductor device. In FIG. 1, reference numeral 1 designates memory cells arranged in row and column directions and reference numeral 12 designates word drivers. In FIG. 1, memory cells arranged adjacent to the word drivers 12 are indicated by hatching. These are affected by the polycrystalline silicon layers in the word drivers and are not symmetrical in the peripheral portions.

Figure 2:
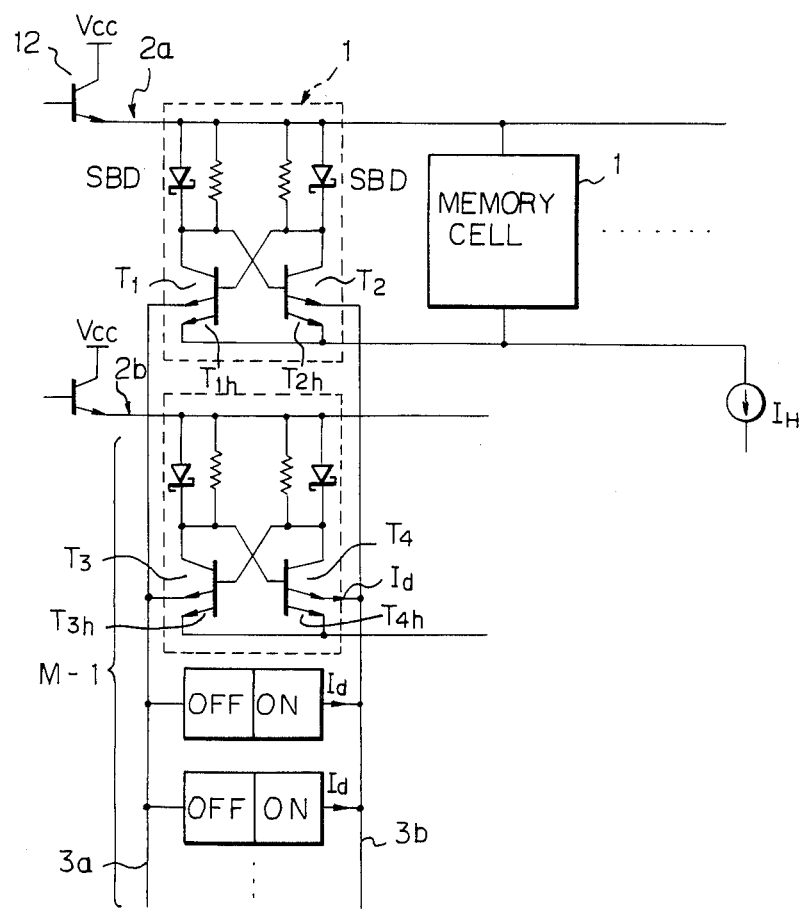
FIG. 2 is a circuit diagram of a conventional semiconductor memory device.

This will be further explained by FIG. 2. In FIG. 2, reference numeral 1 shows memory cells, 2a and 2b word lines, 3a and 3b bit lines and SBD Schottky barrier diodes. In FIG. 2, when data is held, a hold transistor $T_{2h}$ is in the ON state. Therefore, data holding current flows in the collector of the hold transistor $T_{2h}$, the SBD is placed in the ON state, and the potential at the collector of the transistor $T_{2h}$ become lower than that of the word line by the forward voltage $V_F$ of the SBD (i.e., the collector potential becomes "L"). Since the base of the transistor $T_{1h}$ is connected to the "L" level, the transistor $T_{1h}$ is placed in the OFF state, so that the potential at the collector of the transistor $T_{1h}$ become substantially equal to that of the word line. In this holding state, the potential of the bit lines is such that no current flows in the transistors $T_1$ and $T_2$ which have emitters connected to the bit lines 3a and 3b respectively.

When the transistors $T_1$ and $T_{1h}$ are placed in the ON state by the data held in the writing state, the potential of the bit line connected to an emitter of the transistor $T_1$ is made lower than that of the collector of the transistor $T_2$ by $V_{BE}$ of the transistor so as to pass the writing current in the transistor $T_1$. Then, the transistors $T_1$ and $T_{1h}$ are placed in the ON state, the collector of the transistor $T_1$ becomes the "L" level, the transistors $T_2$ and $T_{2h}$ become OFF and the collectors of the transistors $T_2$ and $T_{2h}$ become the "H" level.

When the potential of the bit line is changed from this writing state to a hold state, the hold current $I_H$ in place of $I_W$ flows in the transistor $T_{1h}$, so that the written data is held.

An actual memory device includes many word lines. The potential of one word line is made to the "H" level so as to select one of the same. Now, assume that the difference of the potential on the selected word line $V_{WS}$ and the nonselected word lines $V_{WN}$ is $\Delta V_W = V_{WS} - V_{WN}$. The current $I_W$ flows so that the transistor $T_1$ in the memory cell to be selected is in the ON state and the transistor $T_2$ is in the OFF state. In this state, assume that all memory cells on the same bit line as the cell to be selected have inverted data compared to the selected cell (that is, the transistor $T_{4h}$ is in the ON state). At this time, when the forward voltage $V_F$ of the SBD connected to the collector of the transistor $T_1$ is large, and has a value near $\Delta V_W$, the potential of the collector of the transistor $T_1$, that is, $V_{WS} - V_F$, in the selected cell approaches the potential of the collector of the OFF state transistor $T_{3h}$, that is, $V_{MN} = V_{WS} - \Delta V_W$ in the non-selected cell, so that the current $I_d$ flows in the transistor $T_4$. If the number of the memory cells connected to one bit line is N, the current $I_d$ is multiplied by (N−1). Thus, the current $I_W$ passed in the selected cell becomes $$I_W - I_d(N-1)$$

so that the time for writing the data to the selected cell increases. Therefore the uniformity of the forward voltage $V_F$ of the SBDs in the memory cells is very important from the viewpoint of writing speed.

Figure 3:
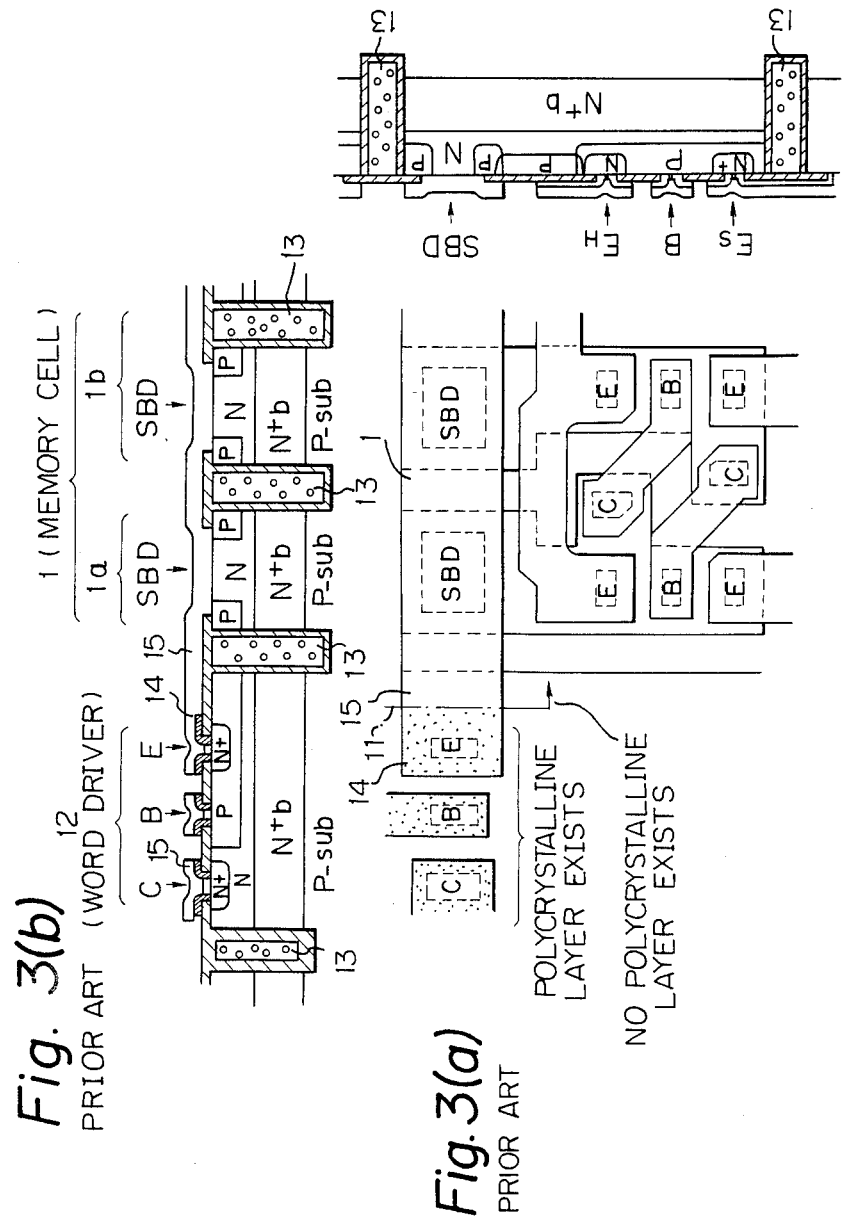
FIGS. 3(a) and (b) are a plan view and a sectional view, respectively, of the circuit shown in FIG. 2.

A plan view and a sectional view of the semiconductor device shown in FIG. 2 are given in FIG. 3(a) and (b), respectively. In FIG. 3, 12 is a word line driver portion, 1 is a memory cell, 1a and 1b are transistors included in the memory cell, and 13 is an isolation layer. In the transistors 1a and 1b, C is a collector contact, B is a base contact, E is an emitter contact, and SBD is a Schottky barrier diode. Further, 14 shows a polycrystalline silicon layer and 15 an aluminum wiring layer. Here, note that the left side of line 11 includes the polycrystalline silicon layer 14, while the right side does not.

In memory cells having SBDs as loads, as explained above, the $V_F$ of the SBD has a very large affect on the characteristics of the semiconductor memory device. Therefore, it is desired to obtain a stable $V_F$ in a chip. However, as shown in FIG. 3, the SBDs near the word line drivers 12 can be affected by the polycrystalline silicon of the emitter of the word line driver 12, so that the $V_F$ may vary.

Furthermore, the SBDs adjacent to the word line drivers 12 do not have the symmetrical pattern layout around them, unlike the SBDs in the other memory cells. Therefore, a tendency occurs in that the $V_F$ of the SBDs is not uniformly formed between the memory cells.

Further, if a series of forward voltages $V_F$ on the word driver side is large, the writing time becomes longer than other memory cell portions and there is the danger that specifications cannot be satisfied. For the purpose of resolving this problem, it is possible to increase $V_W$. However, if $V_W$ is made larger, there is the drawback of an increased readout time. The difference of $V_F$ between the terminal SBD and the other SBDs is more than 100 mV due to manufacturing variations, so it is difficult to set the optimum value.

Figure 4:
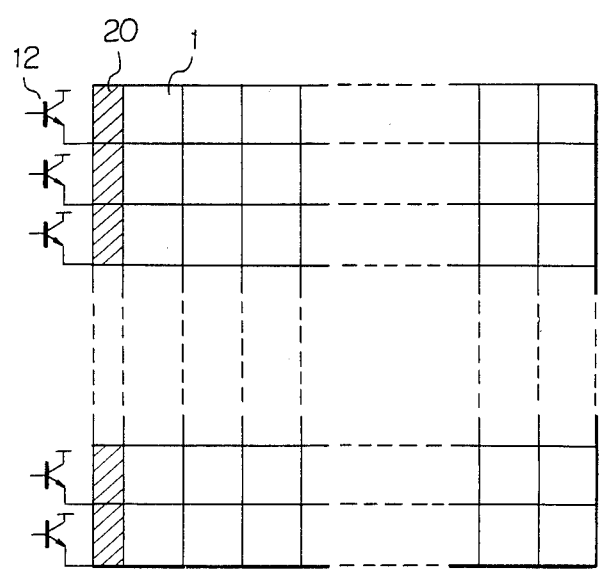
FIG. 4 is the layout of an embodiment according to the present invention.

In the present invention, dummy SBDs 20 are provided separate from the memory cells 1 adjacent to the transistors of the word drivers 12 as shown in FIG. 4, to prevent the SBDs of the memory cells 20 from being affected by the polycrystalline silicon of the transistors in the word line drivers 12.

Embodiments of the invention will now be explained in detail referring to the drawings.

Figure 5:
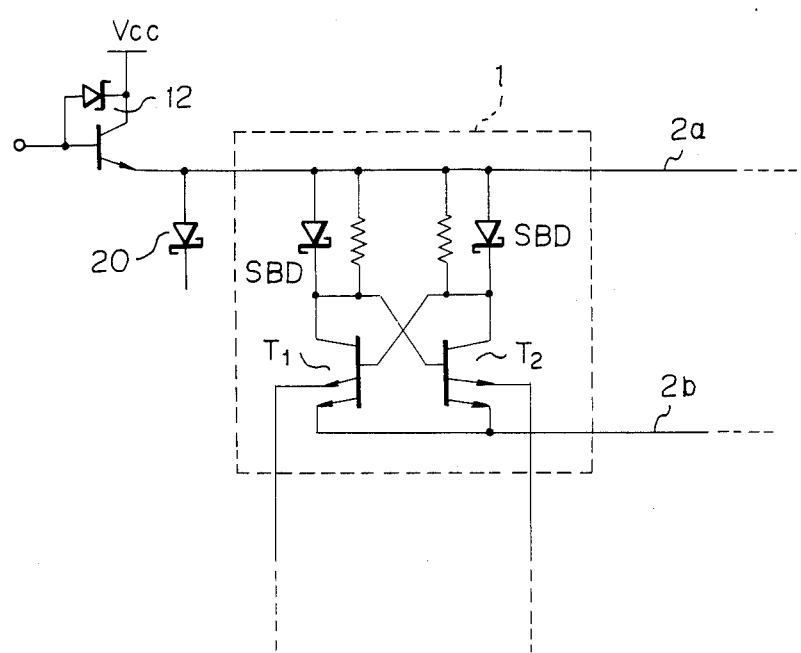
FIG. 5 is a circuit diagram of an essential portion of the semiconductor memory device according to an embodiment of the present invention.

FIG. 5 is a circuit diagram of an embodiment of the present invention. As shown in FIG. 5, the feature of the present invention is to insert dummy SBDs 20 between the word drivers 12 and the memory cells 1 adjacent to the word drivers 12. According to the insertion of such dummy SBDs 20, a SBD having a large $V_F$ is limited to the dummy SBDs 20 not the SBDs in the memory cells 1. Therefore, a constant value of $V_F$ of the SBDs of the memory cells 1 can be obtained.

Figure 6:
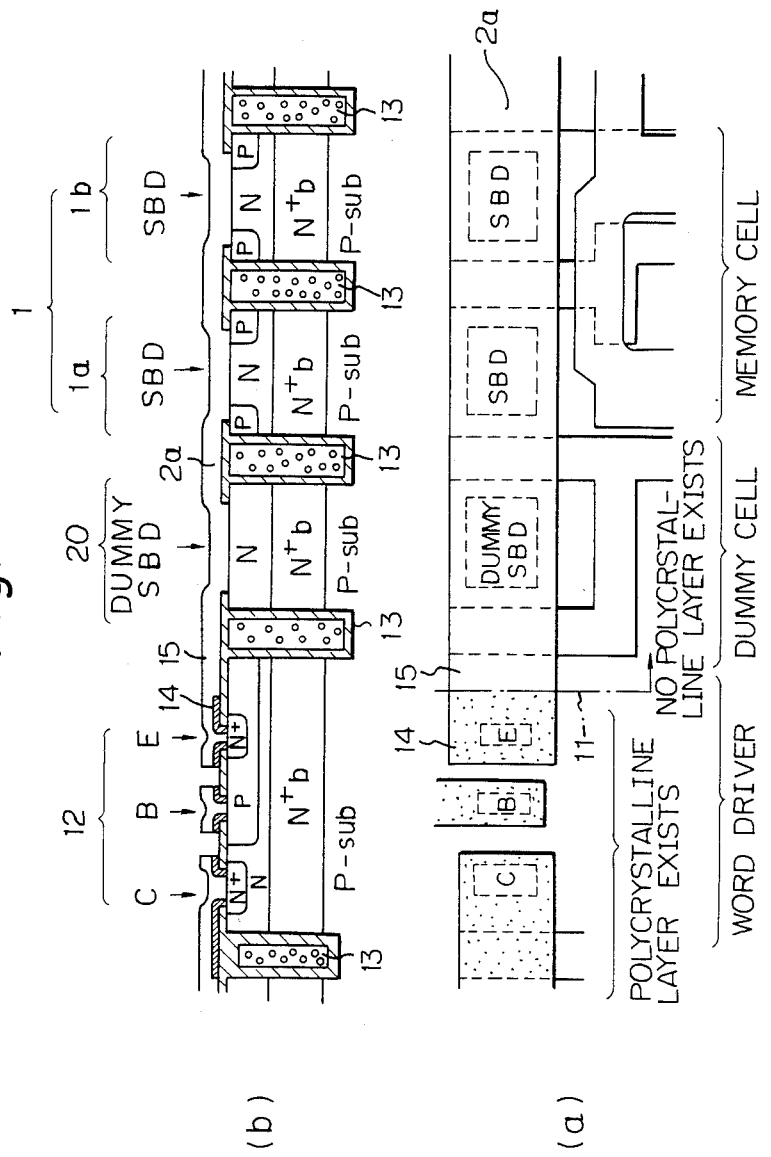
FIGS. 6(a) and (b) are a plan view and a section view, respectively of a portion of the circuit shown in FIG. 5.

FIG. 6 shows the essential portion of a semiconductor integrated circuit including the circuit shown in FIG. 5. In FIG. 6, 1 is a memory cell, 1a and 1b are transistors included therein, 12 is a word driver, and 13 is an isolation layer. The left side of a barrier line 11 shows portions where polycrystalline silicon 14 is formed, and the right side portions where no polycrystalline silicon is formed. 2a is a word line formed by an aluminum layer and connected to the n epitaxial layer so as to form the SBDs in the memory cells 1. Since many memory cells are connected to the word line 2a, a plurality of SBDs couplings are provided along the word line 2a.

As shown in FIG. 6, the dummy SBDs 20 are provided adjacent to the word driver transistor 12, so the effect of the polycrystalline silicon layer of the transistor 12 is stopped at the dummy SBDs 20 and does not reach the SBDs of the memory cells 1. This enables stabilization of the characteristics of $V_F$ in the memory cells 1.

Figure 7:
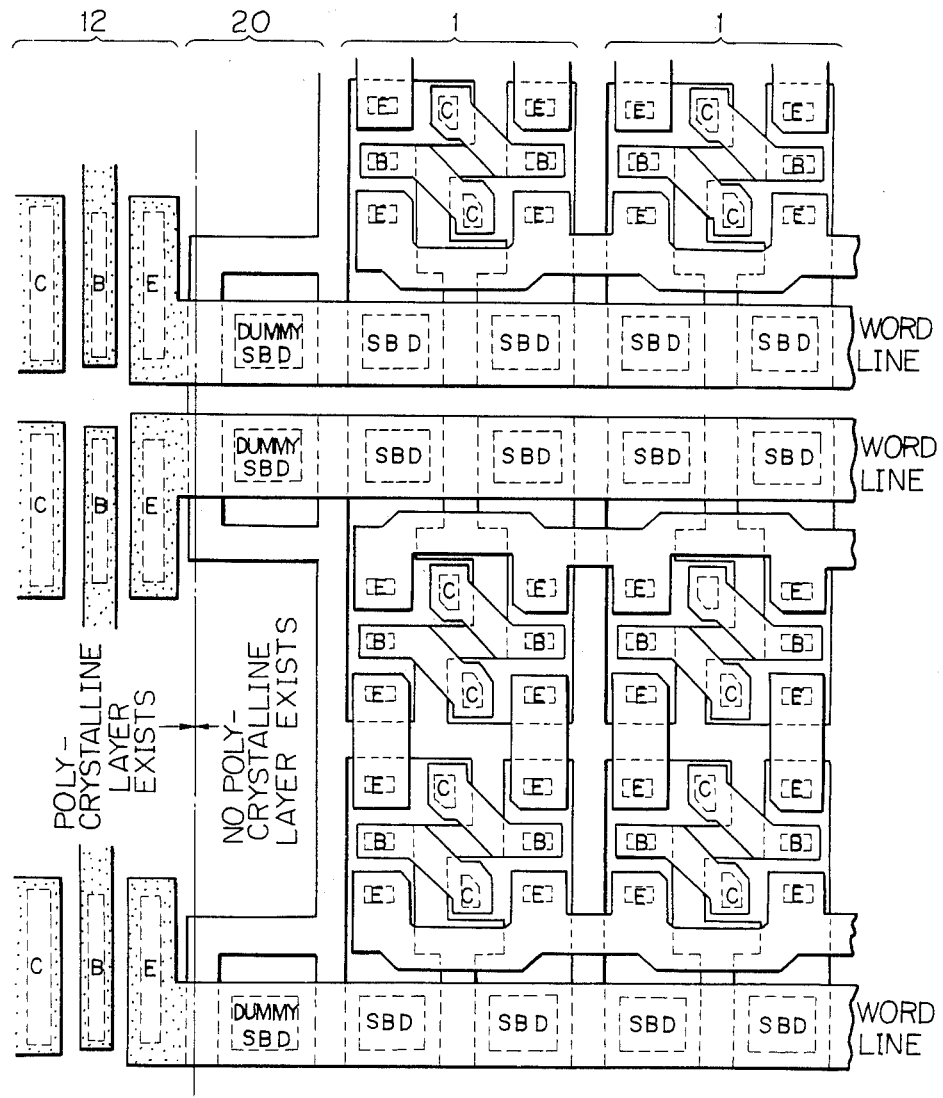
FIG. 7 is a plan view of the semiconductor memory device according to the present invention.

FIG. 7 is a plan view of a semiconductor memory device according to the present invention. The plan view shows a region including two word lines and two columns and clarifies the relationship among the memory cell portion 1, the dummy cell portion 20, and the word driver portion 12.

There appear to be two reasons why the dummy SBDs 20 can prevent the change of $V_F$ of SBDs in the peripheral memory cells 1. First, the length between the polycrystalline silicon layer 14 in word driver transistor 12 and the SBD in peripheral memory cells 1 becomes larger than the prior art, so that there is a smaller effect from the polycrystalline silicon layer 14. Second, according to the dummy SBD insertion, even the SBDs of the peripheral memory cells have a symmetrical layout pattern along the word line layer 2a. Note that the final $V_F$ of the SBD sometimes depends upon the alloy between the aluminum of the word line 2a and the silicon of the n epitaxial layer in the bulk.

As mentioned above in detail, according to the present invention, the value of $V_F$ of the SBDs used in the memory cells becomes stabilized. Thus, circuit design can be optimized and the manufacuring yield can be improved.

We claim:

1. A semiconductor memory cell device comprising:
   a plurality of word lines;
   a plurality of bit lines intersecting said word lines;
   a plurality of memory cells connected at the intersections of said word lines and bit lines, all of said memory cells including Schottky barrier diodes respectively connected to said word lines as loads, and transistors connected to said Schottky barrier diodes and said bit lines;
   word drivers, operatively connected to said word lines, for driving said word lines; and
   dummy Schottky barrier diodes, respectively connected to said word lines between said memory cells and said word drivers, for limiting a forward voltage of said Schottky barrier diodes in said memory cells.

2. A semiconductor memory cell device according to claim 1, wherein each of said memory cells include a pair of said Schottky barrier diodes and a pair of said transistors having collectors operatively connected to said Schottky barrier diodes, having emitters, and having bases, said bases and collectors of said pair of transistors being cross-connected, whereby when one of said transistors in said pair of transistors is on, the other transistor in said pair of transistors is off.

3. A semiconductor memory cell device according to claim 1, further comprising an electric power source, and wherein said word drivers include a transistor operatively connected between said electric power source and said word lines.

4. A semiconductor memory cell device comprising:
a semiconductor substrate;
a plurality of bit lines;
a plurality of memory cells provided on a surface of said semiconductor substrate and separated from each other by an isolation region and connected to said plurality of bit lines, each of said memory cells including a transistor region and a load region, transistors in said transistor region being connected to said bit lines;
word drivers provided on the surface of said semiconductor substrate in a portion of the region in which said memory cells are formed;
word line layers, formed on the surface of said semiconductor substrate and extending along said load region, each of said word line layers connected to said respective word drivers and connected to said load region for forming Schottky barrier diodes; and
dummy Schottky barrier diode regions, provided between each of said memory cells and said word drivers, and operatively connected to said word line layers, for forming dummy Schottky barrier diodes for limiting a forward voltage of said Schottky barrier diodes in said load region.

5. A semiconductor memory device according to claim 4, wherein each transistor region includes a pair of transistors formed therein, and each load region includes said Schottky barrier diodes formed therein, said pair of transistors and said Schottky barrier diodes connected to each other, each of said pair of said transistors having collectors operatively connected to said Schottky barrier diodes, having emitters, and having bases, said bases and collectors of each of said pair of transistors being cross-connected.

6. A semiconductor memory device according to claim 4, wherein each of said word drivers includes a transistor and polysilicon layer formed on the surface of said semiconductor substrate, and wherein said word line layers are respectively connected to said transistor in said word drivers.

7. A semiconductor memory device according to claim 9, wherein said load region is formed of a conduction type semiconductor, wherein said word line layers are metal layers connected to said conduction type semiconductor of said load region for forming said Schottky barrier diodes, wherein said dummy Schottky barrier diode regions are formed of a conduction type semiconductor, and wherein said metal of said word line layers are connected to said conduction type semiconductor of said dummy Schottky barrier diode regions to form said dummy Schottky barrier diodes.

* * * * *